United States Patent [19]
Slimak et al.

[11] Patent Number: 6,040,057
[45] Date of Patent: Mar. 21, 2000

[54] ENHANCING THE STRENGTH, MOISTURE RESISTANCE, AND FIRE-RESISTANCE OF WOOD, TIMBER, LUMBER, SIMILAR PLANT-DERIVED CONSTRUCTION AND BUILDING MATERIALS, AND OTHER CELLULOSIC MATERIALS

[75] Inventors: Robert A. Slimak, Springfield, Va.; Christian C. Haudenschild, Derwood, Md.; Karen M. Slimak, P.O. Box 2444, Springfield, Va. 22152

[73] Assignee: Karen M. Slimak, Springfield, Va.

[21] Appl. No.: 08/843,160

[22] Filed: Apr. 11, 1997

[51] Int. Cl.$^7$ .................................. B05D 1/18; B05D 3/02
[52] U.S. Cl. .......................... 428/453; 427/542; 427/553; 427/554; 427/397.8; 427/439; 427/440; 428/537.1
[58] Field of Search ...................................... 427/542, 553, 427/554, 351, 389.9, 391, 392, 393, 393.3, 393.4, 397, 397.8, 394, 395, 396, 439, 440; 428/537.1, 453

[56] References Cited

U.S. PATENT DOCUMENTS

| | | | |
|---|---|---|---|
| 51,702 | 12/1865 | Devlan | 106/81 |
| 63,618 | 4/1867 | Devlan | 106/81 |

(List continued on next page.)

OTHER PUBLICATIONS

ASTM, 1995. Standard Test Method for Evaluating the Effects of Fire–Retardant Treatments and Elevated Temperatures on Strength Properties of Fire–Retardant Treated Lumber, Designation D 5664–95, ASTM, Philadelphia PA, 599–602.

ASTM, 1992. Standard Test Method for Laboratory Evaluation of Wood and other Cellulosic materials for Resistance to Termites, Designation D 3345–74, ASTM Philadelphia PA, 430–732.

ASTM, 1993. Standard Index of and Descriptions of Textile Heat and Flammability Test Methods and Performance Specifications, Designation D4723–90, ASTM, Philadelphia PA, 480–485.

(List continued on next page.)

*Primary Examiner*—Shrive Beck
*Assistant Examiner*—Michael Barr
*Attorney, Agent, or Firm*—Stevens, Davis, Miller & Mosher, L.L.P.

[57] ABSTRACT

Materials variously treated with sodium silicate were studied until enough information was obtained to find a way to solve the problems that have prevented sodium silicate from being the used as a fire retardant. These problems are: 1) water solubility (miscible with water), which results in extensive leaching when exposed to water, 2) cracking, chipping and peeling of treated surfaces, and 3) surface granulation. During flame tests it was discovered that sodium silicate formed a foam-like material, and this material was found to have become water insoluble, yet its elemental composition had remained virtually identical to that of the unmodified sodium silicate. This investigator proposes that under the influence of heat and dehydration, sodium silicate undergoes a polymerization process resulting in particles sizes too large to dissolve in water, and then developed a mechanism to explain how the process could occur. The temperature and moisture conditions in treated samples were then manipulated to cause the polymerization process to occur while protecting the wood from damage. Thus samples were prepared that were both water insoluble, and possessed effective fire retardant properties. These samples also proved to be stronger than untreated wood, thus providing an improved product that was fire retardant and moisture resistant. Since aqueous sodium silicate can be combined with other inorganic fire retardants, this technique is a potential method for making any inorganic fire retardants moisture resistant. This represents a potential breakthrough in fire retardants that has been sought for approximately 100 years. In addition, sodium silicate treated samples were made moisture resistant by the application of a micro-thin layer of silicon monoxide to the surface of samples. This technique, also never tried before, represents a second method for providing moisture resistant, fire retardant substances.

11 Claims, 4 Drawing Sheets

U.S. PATENT DOCUMENTS

| | | | |
|---|---|---|---|
| 74,225 | 2/1868 | Hildreth | 106/81 |
| 74,587 | 2/1868 | Pelletier | 106/81 |
| 80,086 | 7/1868 | Oertly | 106/84 |
| 109,002 | 11/1870 | Godfrey | 106/81 |
| 293,785 | 2/1884 | Ravenscroft | 106/81 |
| 539,928 | 5/1895 | Wheeler | 106/81 |
| 620,446 | 2/1899 | Grunzweig | 106/83 |
| 627,008 | 6/1899 | Olney | 106/81 |
| 629,600 | 7/1899 | Paltz | 106/81 |
| 1,111,021 | 9/1914 | Hoss | 106/81 |
| 1,125,445 | 1/1915 | Beadle | 106/81 |
| 1,168,831 | 1/1916 | Skalla | 106/81 |
| 1,524,676 | 2/1925 | Stowell | 106/81 |
| 1,532,908 | 4/1925 | Lowe | 106/81 |
| 1,564,706 | 12/1925 | Oelhafen | 106/81 |
| 1,819,364 | 8/1931 | Firth | 106/81 |
| 2,041,120 | 5/1936 | Ellis | 106/81 |
| 2,340,728 | 2/1944 | Baker | 92/21 |
| 2,438,339 | 3/1948 | Jacobs | 106/82 |
| 2,647,069 | 7/1953 | Stericker | 8/111 |
| 3,656,975 | 4/1972 | Phelps, Jr. et al. | 106/1 |
| 3,663,249 | 5/1972 | Rao | 106/75 |
| 3,663,355 | 5/1972 | Shimizu et al. | 161/210 |
| 3,667,978 | 6/1972 | Vassilevsky | 106/105 |
| 3,974,318 | 8/1976 | Lilla | 428/260 |
| 4,443,520 | 4/1984 | Braithwaite, Jr. | 428/438 |
| 4,642,268 | 2/1987 | St.-Michel | 428/453 |
| 4,746,555 | 5/1988 | Luckanuck | 428/35 |
| 5,205,874 | 4/1993 | Crews, IV et al. | 148/254 |
| 5,236,499 | 8/1993 | Chervenak | 106/612 |
| 5,478,598 | 12/1995 | Shiozawa | 427/297 |

OTHER PUBLICATIONS

ASTM, 1993. Standard Methods for Flammability of Treated Paper and Paperboard, Designation D777–93, ASTM, Philadelphia PA, 78–80.

ASTM, 1993. Standard Terminology of Fire Standards, Designation E 176–93a, ASTM, Philadelphia PA, 484–487.

ASTM, 1994. Standard Test Method for Evaluating the Flexural Properties of Fire–Retardant Treated Soft Plywood Exposed to Elevated Temperatures, Designation D 5516–94, ASTM, Philadelphia PA, 559–563.

Avento, J., Touval, I., 1985, Flame retardants, an overview, in *Kirk–Othmer Concise Encyclopedia of Chemical Technology*, John Wiley & Sons, New York, pp. 485–490.

Brown, R., 1980. Pyrolytic methods in organic chemistry; application of flow and flash vacuum pyrolytic techniques. Academic Press, New York.

Chatham, H., 1996. Untitled facsimile transmission. BOC Coating Technology, Concord CA.

Demetrakakes, P., 1993. What'd next for MAP/CAP, susceptors and 'glassy' film? Packaging, a Cahners Publication. 38:10, pp. 24–26.

Famighetti, R., ed. 1996. The world almanac and book of facts. K–111 Reference Corporation, Mahwah, New Jersey.

Lyons, J., 1970. The chemistry and uses of fire retardants, John Wiley & Sons, Inc. New York.

Reisch, M., 1992. Paints and coating sales top $11 billion. C&E News, Oct., 1992. pp. 36–76.

Saxena, K. et al, 1993. Thermodynamic data on oxides and silicates. Springer–Verlag, Berlin.

ENHANCING THE STRENGTH, MOISTURE RESISTANCE, AND FIRE-RESISTANCE OF WOOD, TIMBER, LUMBER, SIMILAR PLANT-DERIVED CONSTRUCTION AND BUILDING MATERIALS, AND OTHER CELLULOSIC MATERIALS

BACKGROUND OF THE INVENTION

1. Field of the Invention

The purpose of this invention is to provide 1) impregnated wood materials introducing a fire retardant property to wood products, 2) impregnation of other cellulosic materials, such as paper and cloth, and other organic compounds in such a way as to allow their intended functions while reducing the risk of flammability, 3) impregnated wood materials introducing increased strength to wood products, and 4) impregnated wood materials introducing decreased solubility of the constituents of the final product thereby providing moisture and leachate and weather resistant products.

Alkali metal silicates, applied to various products can be used to impart fire retardant properties, and this fire retardant property can be maintained and enhanced by simultaneous or subsequent treatment to cause the alkali metal silicates to become water insoluble, thus greatly increasing the applicability and utility of products treated with alkali metal silicates, and also providing a product with improved strength and durability.

2. Description of Related Art

I studied fire retardants and found a new approach for creating water insoluble fire retardants by carefully observing and investigating my burn tests!

In my early work I learned that we really live in a tinderbox surrounded by flammable materials. This became most obvious to me when my own house caught fire two years ago. This is what originally got me interested in fire retardants.

Many organic and inorganic substances for fire retardants have been studied (Lyons 1970, Grayson, 1985). For organic fire retardants two of the major approaches are: 1) converting flammable substances such as common solvents into inflammable substances by reacting them with chemicals such as halogens (e.g., bromine), which are then infused into the wood, and 2) using similar approaches to chemically modify the flammable material such as plastic resin and render the material less flammable. Both of these techniques are expensive and produce toxic fumes. There are many inorganic substances studied for fire retardant properties.

For some fire retardant methods good results are reported in literature. A simple trip to the local lumberyard showed however, that there are apparently very few fire retardants for wood in widespread consumer use. All samples I tested that were purchased at random from local lumber yards burned rapidly.

I chose to study the alkali metal silicate, sodium silicate, because it is relatively cheap, it is inherently nonflammable, there is no discoloration displayed by sodium silicate, and I felt that the adhesive properties of sodium silicate would be useful in some way. Using sodium silicate as a fire retardant, which seemed to me an excellent idea, was apparently not shared by others in the field of fire retardants.

Sodium silicate is only of historical interest in the literature and is not studied at present due to the following facts: 1) sodium silicate is highly water soluble and leaches readily, 2) if you apply it to wood, within a few months it will have completely peeled and chipped away, 3) with air exposure it will form a granular powder that is very irritating to the eyes and hands.

The scientific consensus of sodium silicate is best summed up by Lyons (1970):

"The processes . . . (as protective coating or immersion baths) . . . and its results are principally physical, not chemical in nature and thus no detailed chemical discussion is warranted here."

This was the extent of the knowledge in the field, research studies in the field turned to other materials and to a few combinations with other substances such as tar.

SUMMARY OF THE INVENTION

The purpose of this invention is to provide 1) impregnated wood materials introducing a fire retardant property to wood products, 2) impregnation of other cellulosic materials, such as paper and cloth, and other organic compounds in such a way as to allow their intended functions while reducing the risk of flammability, 3) impregnated wood materials introducing increased strength to wood products, and 4) impregnated wood materials introducing decreased solubility of the constituents of the final product thereby providing moisture and leachate and weather resistant products.

Alkali metal silicates, applied to various products can be used to impart fire retardant properties, and this fire retardant property can be maintained and enhanced by simultaneous or subsequent treatment to cause the alkali metal silicates to become water insoluble, thus greatly increasing the applicability and utility of products treated with alkali metal silicates, and also providing a product with improved strength and durability.

DETAILED DESCRIPTION OF THE INVENTION

The purpose of this invention is to provide 1) impregnated wood materials introducing a fire retardant property to wood products, 2) impregnation of other cellulosic materials, such as paper and cloth, and other organic compounds in such a way as to allow their intended functions while reducing the risk of flammability, 3) impregnated wood materials introducing increased strength to wood products, and 4) impregnated wood materials introducing decreased solubility of the constituents of the final product thereby providing moisture and leachate and weather resistant products.

It is a further purpose of this invention to provide a vitrified product where the vitrification is achieved through partial or total infiltration with, exposure to, or infusion with, or application by any appropriate means, of an aqueous composition containing but not limited to an alkali metal silicate which upon heating will be converted into a composition which, upon cooling, is insoluble, and resistant to pressure and heat.

It is a further purpose of this invention to provide a vitrified product where the vitrification is achieved through partial or total infiltration with exposure to, or infusion with, or application by any appropriate means, of an aqueous composition containing an alkali metal silicate and containing added constituents including but not limited to a detergent, an accelerant and elasticizers which upon heating will be converted into a glass-like composition which, upon cooling, is insoluble, and resistant to pressure and heat.

It is a further purpose of this invention to provide a vitrified product where the vitrification is achieved through partial or total infiltration with exposure to, or infusion with, or application by any appropriate means, of an aqueous composition containing an alkali metal silicate and which may contain one or more added constituents including but not limited to one or more of a detergent, an accelerant and elastacizers which upon heating will be converted into a composition which, upon cooling, is insoluble, and resistant to pressure and heat.

It is a further purpose of this invention to incorporate compositions by any appropriate means into such products other including other alkali metal silicates, inorganic compounds, organic compounds, and combinations thereof that may become trapped, incorporated, combined, bound, and the like in the matrix during the process of vitrification and thus be retained in the final product, further enhancing properties including but not limited to fire retardant properties, insect resistance, strength, hardness, durability, texture and color.

It is a further purpose of this invention to incorporate such compositions either simultaneously, sequentially, or both simultaneously and sequentially by any appropriate means into such products other including other alkali metal silicates, inorganic compounds, organic compounds, and combinations thereof that may become trapped, incorporated, combined, bound, and the like in the matrix during the process of vitrification and thus be retained in the final product, further enhancing properties including but not limited to fire retardant properties, insect resistance, strength, hardness, durability, texture and color.

It is a further purpose of this invention to accomplish the desired improvements in strength and reduced solubility by infusion of energy into the product. Such energy infusion includes but is not limited to radiant heat, electrical current, microwaves, lasers, convection ovens, dehydration, spot heating to high temperatures for short periods of time, and the like.

It is a further purpose of this invention to accomplish the desired improvements in strength and reduced solubility by techniques that achieve the desired improvements without substantial destruction of the interior structure of the wood, cellulosic or other substance as the initial starting material.

It is a further purpose of this invention to accomplish the desired improvements in strength and reduced solubility by techniques that achieve the desired improvements while in the process causing substantial alteration, destruction, or change, combination of starting materials and treatment substances, so as to achieve a final product possessing the desired improvements in strength, reduced solubility, fire retardant properties, insect resistance, strength, hardness, durability, texture, color and the like.

It is a further purpose of this invention to provide improved products of wood, timber, lumber, similar plant derived construction and building materials, other materials of cellulosic origin, other materials of organic origin, and other materials containing constituents including wood, lumber, similar plant derived, cellulosic and/or organic materials that are impregnated with alkali metal silicate, by any desired means including pressure treating, soaking, spraying, painting, washing, dipping, rubbing, mixing, blending, infusion and the like, and rendered impervious to water by the application of heat in such a way as to avoid substantial adverse effects of heat or other energy source.

It is a further purpose of this invention to provide improved products of wood, timber, lumber, similar plant derived construction and building materials, other materials of cellulosic origin, other materials of organic origin, and other materials containing constituents including wood, lumber, similar plant derived, cellulosic and/or organic materials that are impregnated with sodium silicate, by any desired means including pressure treating, soaking, spraying, painting, washing, dipping, rubbing, mixing, blending, infusion and the like, and rendered impervious to water by the application of heat in such a way as to avoid substantial adverse effects of heat or other energy source.

It is a further purpose of this invention to accomplish the desired change in properties of sodium silicate by applying heat to at high enough levels to effect the change to insolubility of sodium silicate in a short enough period of time that the water content of wood or other cellulosic materials provides a localized cooling effect of the water thus providing both protection against destruction and at the same time in some cases participating in the vitrification process.

SUMMARY OF THE EMBODIMENTS

The method embodiment includes methods for modifying wood and other cellulosic material to produce an improved product that is stronger, fire retardant, moisture resistant, insect resistant, utilizing approaches that do not damage the wood. The can be variously accomplished through the use of heating sodium silicate treated wood or other materials to cause the conversion from the soluble form of sodium silicate to the insoluble form thus providing an insoluble matrix which also captures any other desired substances present at the time of conversion to insolubility.

When a high enough temperature (in the form of heat) was applied to sodium silicate, a foam was formed which, upon testing, proved to be water insoluble. From this observation, it was hypothesized that a sodium silicate treated sample could be heated in a fashion that would produce a moisture resistant form of sodium silicate, that would not effect the wood structure and the burn characteristics of the sample.

The strategy was to use the cooling effect of water to cool and protect the wood while the sodium silicate transformation was occurring at higher temperature on the surface, and in the case of microwave heating, the water in the interior is converted to steam, which is much higher in temperature than the boiling point of water, and this higher temperature would cause the conversion of sodium silicate from the water soluble to the water insoluble form.

EXAMPLES OF THE EMBODIMENTS

Pieces of "1×4" pine, 12 inches in length, soaked in a 300 g/kg aqueous sodium silicate solution followed by air drying at ambient conditions for one day, were thermally treated as follows:

Pressed with a hot metal plate (200° C.) over a thin layer of mica,

Pressing a hot metal plate directly on the surface of the sample, 60 sec

Holding a hot metal plate (200° C.) 1 mm above the surface of the sample,

Baked in an industrial convection oven at 260° C. for five minutes,

Heated for five minutes in a microwave,

Quickly dipped in water (5 sec), then placed in an oven preheated at 260° C. for five minutes.

Heated for five minutes in a microwave, wet sample, no prior air drying

Baked in an industrial convection oven at 260° C., wet sample, no prior air drying Pieces of "1×4" pine, 12 inches in length, soaked in a 300 g/kg aqueous sodium silicate solution followed by air drying at ambient conditions for two weeks, were thermally treated as follows:

Baked in a standard oven at 150° C. for an 1.5 hours,

Dipped in distilled water for 5 seconds, baked 5 min@260° C.

Pieces of "1×4" pine, 12 inches in length, soaked 7 days in a 300 g/kg aqueous sodium silicate solution, were immediately thermally treated (while "wet") as follows:

convection oven@500° F., 6.5 min.

microwave 11 minutes, in 3–4 minute intervals, with 1 minute cooling periods microwave 11 minutes, in one interval Pieces of freshly cut (green) pine, soaked 7 days in a 300 g/kg aqueous sodium silicate solution, were immediately thermally treated (while "wet") as follows:

size 2 cm³, microwave 5 min size 1×4×12 inches, microwave 24 min in 4 min increments Pieces of pine, 12 inches in length, soaked 4 days in a 400 g/kg aqueous sodium silicate solution, were dried under ambient conditions for two (@) weeks, and thermally treated as follows:

craft sticks, broiled 5 min@260° C., then foam scraped from surface

1×4×12 inch pine, broiled 5 min@260° C., then foam scraped from surface

Each of these samples was then tested for water solubility to determine the best methods for Imparting moisture resistance throughout the sample. Table 1, below shows the results of the solubility tests and provides information on the surface appearance of each sample.

TABLE 1

Sodium Silicate Treatment Methods -Solubility After Treatment

| Test No | Sample Type | Surface Appearance After Treatment | Sodium Silicate Solubllity After Treatment |
|---|---|---|---|
| 6 | 300 g/kg, soaked 4 days, dried, ambient conditions, 2 weeks, baked 1.5 hr @ 200° C. | Dark brown, many surface splits and cracks, numerous pine resin beads present | 0 g/kg |
| 7 | 300 g/kg, soaked 4 days, dried ambient, 1 day, microwave 5 minutes | Slightly darker yellow color, some sodium silicate bubbles | 0 g/kg |
| 8 | 300 g/kg, soaked 4 days, dried ambient, 1 day, baked 5 min in industrial convection oven @ 500° F. | Slightly darker yellow color, some sodium silicate bubbles | 20 g/kg |
| 9 | 300 g/kg, soaked 4 days, dried ambient, 1 day, 400° F. hot plate, 60 sec | Moderate scorching | 4 g/kg |
| 10 | 300 g/kg soaked 4 days, dried ambient, 1 day, 1/16 inch above 400° F. hot plate, 60 sec | Slight scorching | 4 g/kg |
| 11 | 300 g/kg, soaked 4 days, dried ambient, 1 day, 400° F. hot plate, over mica plate, 60 sec | Moderate scorching | 100 g/kg |
| 12 | 300 g/kg, soaked 3 days, dried, ambient conditions, 2 weeks, soaked in water for 5 seconds, baked 5 min @ 300° C. | Virtually unchanged | 0 g/kg |
| 13 | 300 g/kg, soaked 7 days, wet (no drying), convection oven @ 500° F., 6.5 min. | Moderate darkening, moderate foam formation, very slight resin beading | 1 g/kg |
| 14 | 300 g/kg, soaked 7 days, wet (no drying), microwave 11 minutes, in 3–4 minute intervals, with 1 minute cooling periods | Slightly darker yellow, some protruding foam from ends, slight amount of blistering of surface | 0.0004 g/kg |
| 15 | 300 g/kg, soaked 7 days, wet (no drying), microwave 11 minutes | Moderately darker, protruding foam from ends, large cracks present | 1 g/kg |
| 16 | 300 g/kg, green pine, 2 cm cube, soaked 1 week, no drying, microwave 5 min | Some sodium silicate protruding from ends, much harder material | 0 g/kg |
| 17 | 300 g/kg, 1 × 4 green pine, soaked 1 week, no drying, microwave 24 min in 4 min increments | Sodium silicate oozing from cut ends, still obviously wet | 0.4 g/kg |
| 18 | 400 g/kg, 1 × 4, soaked 4 days, dried, ambient conditions, 2 weeks, broiled 5 min @ 260° C., then foam scraped from surface | Moderately brown, powdery appearance due to foam scraping | 4 g/kg |
| 19 | 400 g/kg, craft stick, soaked 4 days, dried, ambient conditions, 2 weeks, broiled 5 min @ 260° C., then foam scraped from surface | Moderately brown, powdery appearance due to foam scraping | 1 g/kg |

BRIEF DESCRIPTION OF THE DRAWINGS

FIG. 1 presents the solubility for example embodiments, graphed on a logrithmic scale. The initial solubility for all samples was the fully soluble form of sodium silicate, which is miscible with water. The data show samples 6, 7, 12, 14, 16, identified in Table 1, above, to have become totally insoluble, and 7 additional samples to have solubility reduced to 4 g/kg or below. In many applications, a reduction to this lower level of solubility would be sufficient to be suitable for many applications.

FIG. 2 shows the weight loss profiles of an untreated wood control (23) and the following five wood samples treated with sodium silicate: (24): thoroughly dried, 5 second water dipped, and broiled for 2.5 minutes; (25): sample air dried 1 day, microwaved for 5 minutes; (26): 300 g/kg sodium silicate unmodified; (27): soaked in 300-g/kg sodium silicate, treated while wet by microwave for 11 minutes in 3 minute increments, and (28): thoroughly dried, baked at 300° F. for 1.5 hours. All the sodium silicate treated samples exhibited a lower per cent weight loss than the untreated control. Poorest results among the treated samples was obtained with the thoroughly dried, baked sample (28). In comparison to the thoroughly dried sample, percent improvement of 50% and greater was obtained with samples that were not thoroughly dried.

FIG. 3 shows in ribbon-plot format the weight loss profiles of the unmodified sodium silicate in water soluble form as a control (26) and an untreated wood sample as a control (23) and three sodium silicate samples treated to become insoluble: 1) insoluble sodium silicate sample—water dipped, and broiled (24); 2) insoluble sodium silicate sample—dried 24 hours and subsequent, microwave (25); and 3) insoluble sodium silicate sample prepared by treating the wet sodium silicate soaked sample by microwave treatment for 3 each, four minute intervals (29). Best results (30) were obtained from the insoluble sodium silicate sample—dried 24 hours and subsequent, microwave (25); and from the insoluble sodium silicate sample—water dipped, and broiled (24).

FIGS. 2 and 3 show the results of flame tests conducted on samples treated with alkali metal silicates. Each of these samples had been treated to provide an insoluble form of sodium silicate, thereby imparting moisture resistance to the sample. The samples were replicated and subjected to burn tests to determine whether fire retardant properties were retained. The data show that it was possible to provide example embodiments possessing the desired insolubility level and also retaining the desired flame retardant properties. The data also show that through the application of the principles of the instant invention, improved flame retardant properties were achieved.

FIG. 4 presents both depth of penetration (depression) (dark gray bar) and hole diameter (light gray bar) for each of the eight samples (a–h). FIG. 4a shows depth of penetration and hole diameter for a 1×4 greenwood sample treated with sodium silicate solution (300 g/kg) that was subjected to microwave treatment. FIG. 4b shows depth of penetration and hole diameter for a 1×4 sample treated with sodium silicate solution (300 g/kg) that was subjected to drying followed by soaking briefly and then baking. FIG. 4c shows depth of penetration and hole diameter for a 1×4 sample treated with sodium silicate solution (300 g/kg) that was subjected to microwave treatment in 3 minute intervals. FIG. 4d shows depth of penetration and hole diameter for a 1×4 sample treated with sodium silicate solution (300 g/kg) that was subjected while still wet, to microwave treatment for 11 minutes. FIG. 4e shows depth of penetration and hole diameter for a 1×4 sample treated with sodium silicate solution (400 g/kg) that was subjected to baking. FIG. 4f shows depth of penetration and hole diameter for a 1×4 sample treated with sodium silicate solution (300 g/kg) that was subjected while still wet, to baking in a convection oven. FIG. 4g shows depth of penetration and hole diameter for a 1×4 sample treated with sodium silicate solution (300 g/kg) that was subjected to drying for 1 day followed by microwave treatment for 5 minutes. FIG. 4h shows depth of penetration and hole diameter for an untreated 1×4 sample as a control. The y-axis presents a scale (0–8) representing the depth of penetration (height) and hole diameter in mm.

FIGS. 4a–4h also present the increase in hardness for each sample when compared to the untreated control. The increase in hardness for each sample was as follows:

Figure 1:
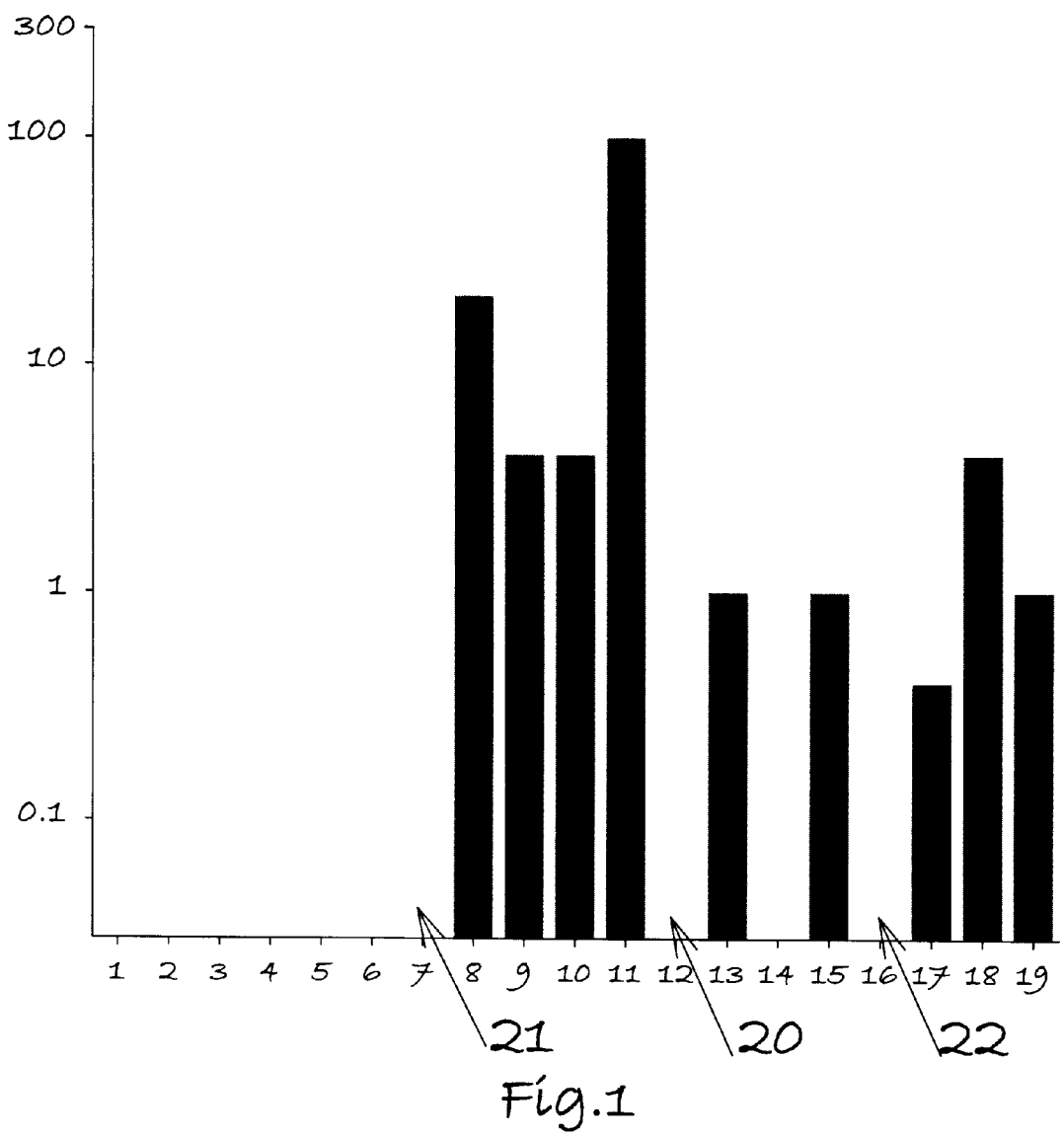
FIG. 1 compares the sodium silicate solubility obtained after treatments 6–19 of Table 1 were applied to 1×4 samples. The y-axis of FIG. 1 presents a solubility scale, as determined by microscopic comparison (g/kg). Along the x-axis, solubility for vapor deposition samples is presented in treatment method numbers 1–5, and sodium silicate solubility for treatment methods 6–19 of Table 1 is presented in treatment method numbers 6–19. The results obtained for three samples are emphasized in FIG. 1, sample 12 treated by sodium silicate soaked, thoroughly dry, water dip, and baked 5 minutes at 260° C. (20), sample 7 treated by sodium silicate soaked, dried 24 hours, and then treated by microwave for 5 minutes (21), and sample 16, green wood that was treated by sodium silicate soaked, and then treated by microwave for 5 minutes (22).
Figure 2:
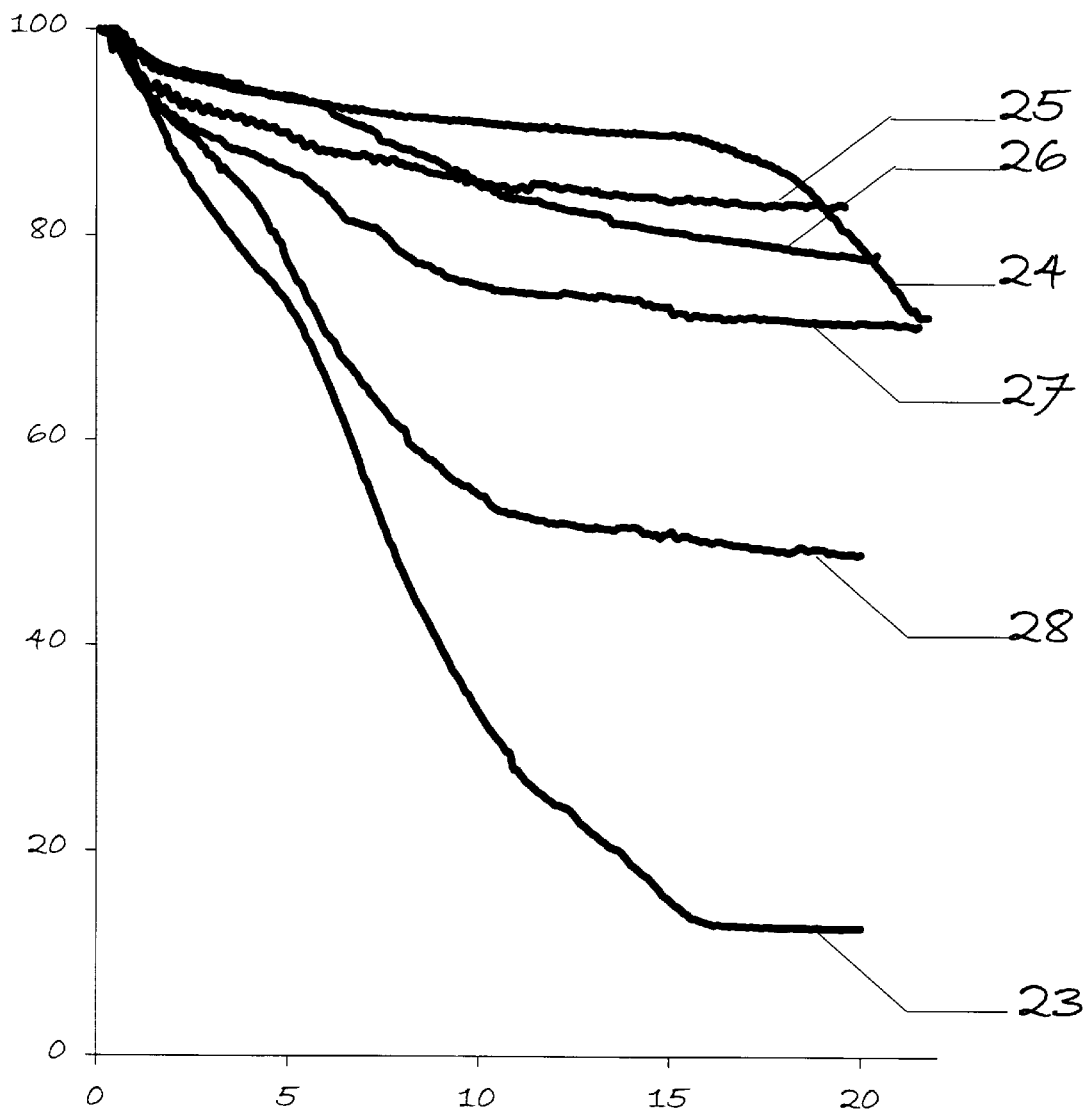
FIG. 2 compares the weight loss profiles in moisture resistant 300 g/kg sodium silicate treated samples. The y-axis presents a scale (0–100) of the percent (%) of samples remaining unburned after burn tests were conducted. Burn duration scale in minutes (0–22) is presented along the x-axis.
Figure 3:
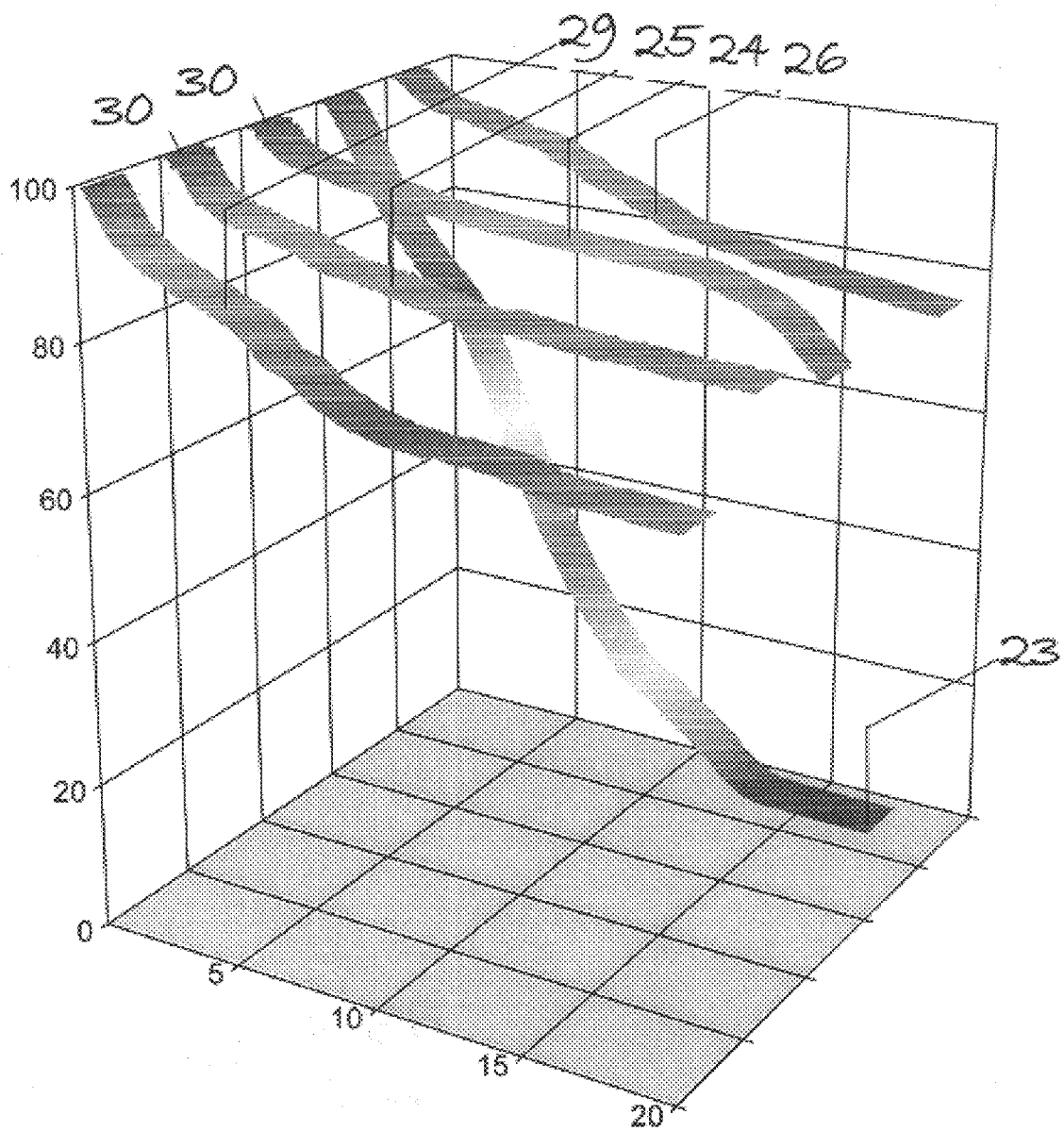
FIG. 3 compares fire retardance achieved in water insoluble sodium silicate treated samples. All treated samples were 1×4 yellow pine samples, each treated with sodium silicate by soaking for 4 days in a 300 g/kg aqueous sodium silicate solution. Burn duration scale in minutes (0–20) is presented along the y-axis. The z-axis presents a scale (0–100) of the percent (%) of samples remaining unburned after burn tests were conducted. The x-axis, presents the results for each sample tested.

| | |
|---|---|
| 1 × 4 greenwood sample treated with sodium silicate solution (300 g/kg) that was subjected to microwave treatment (FIG. 4a): | 50% improvement (30) |
| 1 × 4 sample treated with sodium silicate solution (300 g/kg) that was subjected to drying followed by soaking briefly and then baking (FIG. 4b): | 25% improvement (31) |
| 1 × 4 sample treated with sodium silicate solution (300 g/kg) that was subjected to microwave treatment in 3 minute intervals (FIG. 4c): | 25% improvement (32) |
| 1 × 4 sample treated with sodium silicate solution (300 g/kg) that was subjected while still wet, to microwave treatment for 11 minutes (FIG. 4d): | 18.75% improvement (33) |
| 1 × 4 sample treated with sodium silicate solution (400 g/kg) that was subjected to baking (FIG. 4e): | 18.75% improvement (34) |
| 1 × 4 sample treated with sodium silicate solution (300 g/kg) that was subjected while still wet, to baking in a convection oven (FIG. 4f): | 6% improvement (35) |
| 1 × 4 sample treated with sodium silicate solution (300 g/kg) that was | 6% improvement (36) |

-continued subjected to drying for 1 day followed by microwave treatment for 5 minutes (FIG. 4g):
an untreated 1 × 4 sample as a control (FIG. 4h):

For each sample tested there was an increase in hardness when compared to the untreated control. The values ranged from 6% for a sample dried 1 day followed by microwave treatment (36), to 50% for a sample of green wood soaked in sodium silicate solution and immediately treated by microwave radiation (30).

To test durability and ability to use in many ways that dimension lumber is used, sodium silicate treated wood, 1.9 cm×3.7 cm×30.5 cm yellow pine samples that had been soaked in 300 g/kg sodium silicate solution and allowed to air dry, were subjected to normal construction type activities including hammering, sawing, drilling and nailing. The samples were cut by band sawing, and with an electric band saw. The samples in combination with other non-treated materials were used in an exterior construction project, and observed over a one year time period. No difference was observed between treated and untreated samples, in terms of normal construction activities. No splitting of wood was found; no loosening of nails was found.

To test for hardness in moisture resistant sodium silicate samples, samples that were found to be both water insoluble and highly fire retardant were tested for hardness according to ASTM method C870 A1, Consistency by Cone Penetration Test Method. This test measures in millimeters the penetration of a conical plunger into a mortar sample. Depth of penetration measured in millimeters the resistance of the material to permanent deformation be an indenter of specific size and shape under a known load. A 200 g cone, held inside a vertical plexiglas tube, was dropped from a height of 100 cm, and allowed to plunge into the sample. The depth of penetration was measured by marking the wood-cone interface on the cone, removing the cone from the samples and measuring the distance from the mark to the tip of the cone. The width of the depression was also measured.

Figure 4:
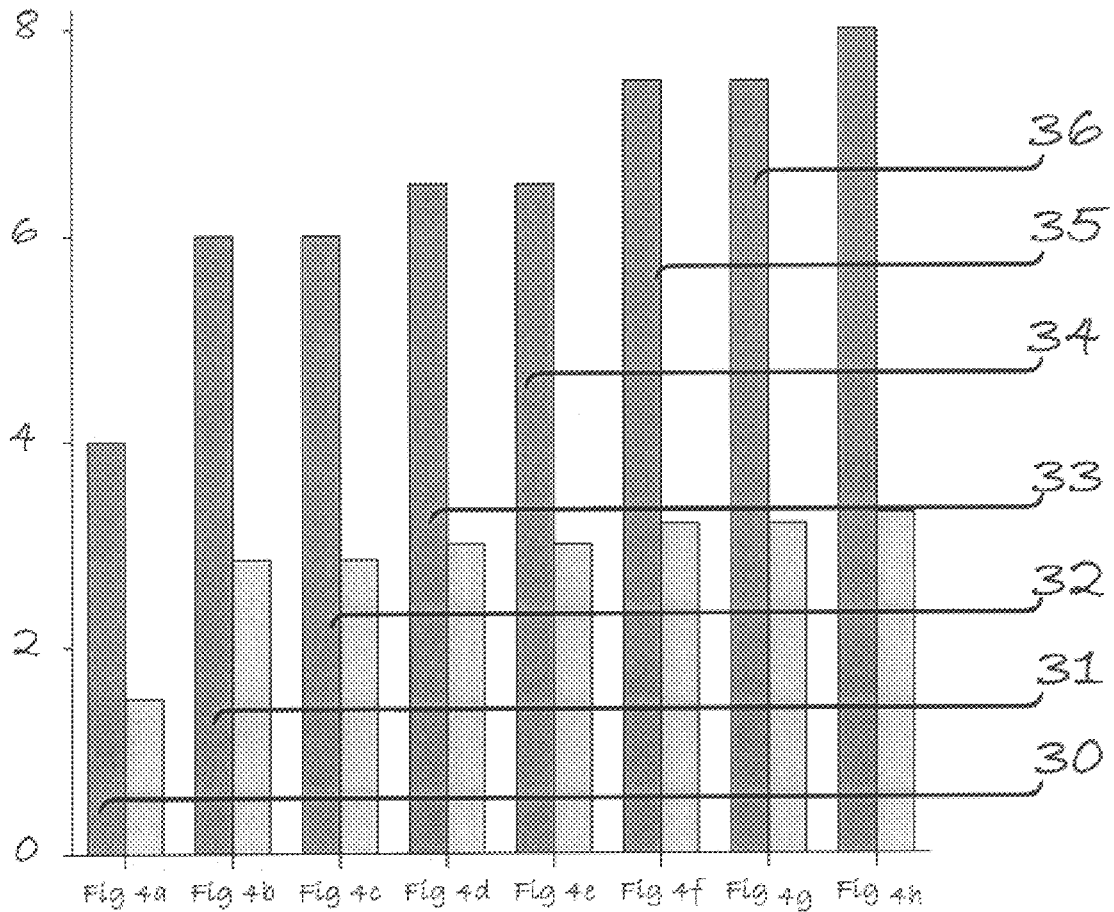
FIG. 4 contains eight figures (a–h) that are presented side by side to compare the hardness in sodium silicate treated 1×4 pine samples as measured by cone penetration tests.

The results were compared to that obtained for untreated pine controls and are presented in FIG. 4. Hardness data obtained for a sample that combined metal alkali silicate infusion with microwave heating was also obtained. Under conditions tested that produced the results shown in FIG. 4, no indentation was made in the sample from a height of 100 cm. This indicates that by manipulating treatment conditions a wide range of hardness was achieved and that this allows wood samples to be designed for the desired hardness as well as water solubility and flammability.

$SiO_n$ growth occurs by condensation (polymerization). As each Si unit is linked, water is lost. However, in basic solution, hydrogens are removed from each terminal oxygen. Process is accelerated as water is removed from the system, shifting equilibrium toward larger networked structures. Thus a possible explanation for the observed change in solubility properties is that the water insoluble form of sodium silicate has undergone a condensation type of polymerization process that has caused the silicate ions to become too large to dissolve in water. Silicon and oxygen atoms from two sodium silicate ions covalently bond, forming a $Si_2O_7$— ion and releasing one molecule of water. The flame provides the energy for this reaction to occur. As water molecules evaporate due to the heat, the sodium silicate ion continues to condense with other sodium silicate ions and grow in size; as it grows, it's overall negative charge is dispersed over ever increasing size and becomes weaker. If this process continues to occur, at some point the ions become too large and the overall negative charge becomes too weak to dissolve in water, and water insolubility occurs. And in that difference I found the key to a possibly important new approach to fire retardant materials.

This is the exciting part, because I thought, "I think this mechanism suggests a way to solve the problem of water solubility."—In the presence of fire, sodium silicate becomes insoluble. I just needed to find a way to do this before hand without destroying the wood.

I tried many approaches, I used wood treated with sodium silicate completely dry, partially dry, and completely wet. I applied heat by pressing hot plates onto the wood, baking at many temperatures, micro waving, and applying radiant heat. The best techniques found are: treating wood with sodium silicate, drying thoroughly, dipping in water for 5 seconds, and heating 2½ minutes at 260° C. In this technique, the outer layer is found to be completely insoluble, with a fine surface. The other excellent technique is to treat wood with sodium silicate, let it dry for 24 hours, then microwave for 5 minutes. The sodium silicate is insoluble throughout the wood.

The flame tests for these methods are spectacular. In some ways, these tests are even better than sodium silicate alone.

There are added benefits of using sodium silicate: the wood is stronger, lighter, less compressible, termites hate it, and in the interior of the wood acts like reinforced cement.

The following publications are herein incorporated in their entirety by reference.

1. ASTM, 1992. Standard Test Method for Laboratory Evaluation of Wood and other Cellulosic materials for Resistance to Termites, Designation D 3345- 74, ASTM, Philadelphia Pa., 430–732.
2. ASTM, 1993. Standard Index of and Descriptions of Textile Heat and Flammability Test Methods and Performance Specifications, Designation D 4723- 90, ASTM, Philadelphia Pa., 480–485.
3. ASTM, 1993. Standard Methods for Flammability of Treated Paper and Paperboard, Designation D 777 - 93, ASTM, Philadelphia Pa., 78–80.
4. ASTM, 1993. Standard Terminology of Fire Standards, Designation E 176 - 93a, ASTM, Philadelphia Pa., 484–487.
5. ASTM, 1994. Standard Test Method for Evaluating the Flexural Properties of Fire-Retardant Treated Soft Plywood Exposed to Elevated Temperatures, Designation D 5516-94, ASTM, Philadelphia Pa., 559–563.
6. ASTM, 1995. Standard Test Method for Evaluating the Effects of Fire-Retardant Treatments and Elevated Temperatures on Strength Properties of Fire-Retardant Treated Lumber, Designation D 5664- 95, ASTM, Philadelphia Pa., 599–602.
7. Avento, J., Touval, I., 1985, Flame Retardants, An Overview, in Kirk-Othmer Concise Encyclopedia of Chemical Technology, John Wiley & Sons, New York, pp. 485–490.

8. Baker, C., et al, 1944. Method of sizing paper. U.S. Pat. No. 2,340,728.
9. Beadle, G., 1915. Process of manufacturing compoboard. U.S. Pat. No. 1,125,445.
10. Brown, R., 1980. Pyrolytic methods in organic chemistry; application of flow and flash vacuum pyrolytic techniques. Academic Press, New York.
11. Chatham, H. 1996. Untitled facsimile transmission BOC Coating Technology, Concord Calif.
12. Chervenak, R., 1993. Sprayable wall sealant. U.S. Pat. No. 5,236,499.
13. Crews, IV et al. Process of protecting metallic and wood surfaces using silicate compounds. U.S. Pat. No. 5,205,874.
14. Demetrakakes, P., 1993. What's next for MAP/CAP, susceptors and 'Glassy' film? Packaging, a Cahners Publication. 38:10, pp. 24–26.
15. Devlan, P., 1865. Improved composition for lining journal-boxes. U.S. Pat. No. 51,702.
16. Devlan, P., 1867. Improvement in coating wood, U.S. Pat. No. 63,618.
17. Ellis, G., 1936. Heat and sound insulating composition U.S. Pat. No. 2,041,120.
18. Famighetti, R, ed. 1996. The world almanac and book of facts. K-111 Reference Corporation, Mahwah, N.J.
19. Firth, L., and Welch, E., 1931. Hot top. U.S. Pat. No. 1,819,364.
20. Godfrey, J., 1870. Improvement in roofing compositions. U.S. Pat. No. 109,002.
21. Grunzweig, C., 1899. Manufacture of stone from kieselguhr. U.S. Pat. No. 620,446.
22. Hildreth, E., 1868. Improved composition of matter for forming ornaments. U.S. Pat. No. 74,225.
23. Hoss, C., 1914. Fireproof material, U.S. Pat. No. 1,111,021.
24. Jacobs, M., 1948. Laminated sheet and composition for coating laminae. U.S. Pat. No. 2,438,339.
25. Lowe, W., 1925. Plastic composition for articles of manufacture, U.S. Pat. No. 1,532,908.
26. Luckanuck, J., 1987. Fire retardant composition. U.S. Pat. No. 4,746,555.
27. Lyons, J., 1970. The Chemistry and Uses of Fire Retardants, John Wiley & Sons, Inc. New York.
28. Oelhafen, J., 1925. Wall-board composition. U.S. Pat. No. 1,564,706.
29. Oertly, B., and Fendrich, X., 1868. Improved composition for coating metals. U.S. Pat. No. 80,086.
30. Olney, G., 1899. Composition of matter. U.S. Pat. No. 627,008.
31. Pelletier, A., 1868. Improved composition for manufacturing stone, and for other purposes. U.S. Pat. No. 74,587.
32. Platz, R., 1899. Composition of matter for molding purposes. U.S. Pat. No. 629,600.
33. Ravenscroft, W., and Ravenscroft, W., 1884. Manufacture of articles from wood pulp. U.S. Pat. No. 293,785.
34. Reisch, M., 1992. Paints and coating sales top $11 billion. C&E News, October, 1992. Pps. 36–76.
35. Saxena, K. et al, 1993. Thermodynamic Data on Oxides and silicates. Springer-Verlag, Berlin.
36. Skalla, F., 1916. Process of molding a compressed fiber composition. U.S. Pat. No. 1,168,831.
37. Stericker, W., 1953. Manufacture of silicate-coated papers. U.S. Pat. No. 2,647,069.
38. Stowell, E., 1925. Fireproofing and insulating composition and process of making the same. U.S. Pat. No. 1,524,676.
39. Vassilevsky, A., et al, 1972. Light-weight high strength cement compositions. U.S. Pat. No. 3,667,978.
40. Wheeler, J., 1895. Process of molding fibrous pulp. U.S. Pat. No. 539,928.

We claim:

1. A process of imparting fire retardant and moisture resistant properties to a cellulosic material comprising applying and infusing a material consisting of an alkali metal silicate solution, applying energy to said material under sufficient conditions to thereby cause the alkali metal silicate to become water insoluble.

2. The process of claim 1 wherein the solution application step is selected from the group consisting of soaking and pressure treating.

3. The process of claim 1 wherein the alkali metal silicate is sodium silicate.

4. The process of claim 1 wherein the cellulosic material is subjected to complete or partial drying following the application step.

5. The process of claim 4 wherein the drying is selected from the group consisting of microwaves, lasers, and radiant heat.

6. The process of claim 3 wherein the sodium silicate solution has a concentration of 0.04–400 g of sodium silicate per kilogram of water.

7. The product produced by the process of claim 1.

8. The product produced by the process of claim 4.

9. The product of claim 1 wherein the product possesses the property of increased hardness and durability.

10. The product of claim 1 where the product possesses the property of increased fire retardance.

11. The product of claim 1 wherein the product possesses the property of improved resistance to chipping and peeling.

* * * * *